(12) United States Patent
Chen et al.

(10) Patent No.: US 9,391,255 B2
(45) Date of Patent: Jul. 12, 2016

(54) MULTISTAGE THICK FILM THERMOELECTRIC DEVICES

(75) Inventors: Gang Chen, Carlisle, MA (US);
Xiaoyuan Chen, Acton, MA (US);
Ronggui Yang, Broomfield, CO (US)

(73) Assignee: MASSACHUSETTS INSTITUTE OF TECHNOLOGY, Cambridge, MA (US)

(*) Notice: Subject to any disclaimer, the term of this patent is extended or adjusted under 35 U.S.C. 154(b) by 1721 days.

(21) Appl. No.: 11/668,765

(22) Filed: Jan. 30, 2007

(65) Prior Publication Data
US 2008/0178606 A1 Jul. 31, 2008

(51) Int. Cl.
*H01L 35/32* (2006.01)

(52) U.S. Cl.
CPC .................. *H01L 35/325* (2013.01)

(58) Field of Classification Search
USPC .......................................... 136/203
See application file for complete search history.

(56) References Cited

U.S. PATENT DOCUMENTS

| | | | |
|---|---|---|---|
| 4,947,648 A | 8/1990 | Harwell et al. | |
| 5,237,821 A | 8/1993 | Okumura et al. | |
| 5,385,022 A | 1/1995 | Kornblit | |
| 6,207,887 B1* | 3/2001 | Bass | H01L 35/32 136/201 |
| 6,452,740 B1 | 9/2002 | Ghoshal | |
| 6,472,459 B2 | 10/2002 | Morales et al. | |
| 6,505,468 B2 | 1/2003 | Venkatasubramanian | |
| 6,552,256 B2 | 4/2003 | Shakouri et al. | |
| 6,787,691 B2 | 9/2004 | Fleurial et al. | |
| 7,465,871 B2 | 12/2008 | Chen et al. | |
| 2002/0071223 A1 | 6/2002 | Ghoshal | |
| 2003/0141455 A1* | 7/2003 | Lambert et al. | 250/353 |
| 2004/0251539 A1 | 12/2004 | Faris et al. | |
| 2005/0139250 A1* | 6/2005 | DeSteese | H01L 35/16 136/212 |
| 2009/0007952 A1* | 1/2009 | Kondoh et al. | 136/203 |

FOREIGN PATENT DOCUMENTS

| | | |
|---|---|---|
| CA | 750573 | 1/1967 |
| GB | 928878 | 6/1963 |
| GB | 1048483 | 11/1966 |
| WO | WO2006043514 | * 4/2006 |

OTHER PUBLICATIONS

Chen, G., et al. "Recent Developments in Thermoelectric Materials," International Materials Review, vol. 48, Feb. 2003, pp. 45-66.
(Continued)

*Primary Examiner* — Jennifer Michener
*Assistant Examiner* — Dustin Q Dam
(74) *Attorney, Agent, or Firm* — Nutter McClennen & Fish LLP

(57) ABSTRACT

The present invention generally provides multistage thermoelectric coolers and methods for their fabrication. For example, in one aspect, a multistage thermoelectric cooler is disclosed that includes at least two cooling stages, each of which comprises a p-type leg portion and an n-type leg portion coupled to form a p-n junction. The p-n junctions of the two stages are thermally and electrically coupled such that at least a portion of a current flowing, during operation of the device, through one stage is coupled to the other. Further, at least one of the p- or n-type leg portions of one stage forms a unitary structure with a corresponding p- or n-type leg portion of the other stage.

20 Claims, 15 Drawing Sheets

(56) References Cited

OTHER PUBLICATIONS

Lai et al. "Optimum design on the performance parameters of a two-stage combined semiconductor thermoelectric heat pump," IOP Publishing Ltd., Semicond. Sci. Technol. 19 (2004) 17-22.

Fleurial, J.P., et al., Thermoelectric Microcoolers for Thermal Management Applications, ICT'97, 641 (1997).

Goldsmid, H.J., Thermoelectric Refrigeration, Chptr. 3, Selection of Materials, p. 42-43, Plenum Press, New York, 1964.

Harman, T.C., et al., "Quantum Dot Superlattice Thermoelectric Materials and Devices," Science, 297, 2229, 2002.

Jacquot, A., et al., "Fabrication and Modeling of a Thermoelectric Micro-Generator," Proceedings of International Conference on Thermoelectrics, ICT'02, pp. 561-564, Long Beach, CA, Aug. 24-29, 2002.

Kishi, M., et al. "Micro-Thermoelectric Modules and Their Application to wristwatches as an Energy Source," Proceedings of ICT'99, pp. 301-308 (1999).

Li, J.F., et al., "Microfabrication of Thermomelectric Materials by Silicon Molding Process," Sensors and Actuators, A 108, pp. 97-102 (2003).

Ren, Z.F., et al., "Synthesis of Large Arrays of Well-Aligned Carbon Nanotubes on Glass", Science, 282, 1105-1107 (1998).

Snyder, G.J., et al., "Thermoelectric Microdevice Fabricated bya MEMS-Like Electrochemical Process," Nature Materials, vol. 2, pp. 528-531 (2003).

Snyder, J., et al., "Supercooling of Peltier Cooler Using a Current Pulse," Journal of Applied Physics, 92, 1564-1569 (2002).

Tsuei, C.C., et al., "Half-Integer Flux Quantum Effect and Pairing Symmetry in High-Tc One-Layer Tetragonal Tl2Ba2CuO6+8 Superconductors", Science, 271, 329 (1996).

Venkatasubramanian, R., et al., "Thin-film thermoelectric devices with high room-temperature figures of merit," Nature, 413, pp. 597-602, 2001.

Volklein, F., et al., "Thermoelectric Microsensors and Microactuatirs (MEMS) Fabricated by Thin Film Technology and Micromachining," Proc. ICT'99, 285 (1999).

Wang, W.Z., et al., "Synthesis of Germanium Nanocrystals at Gram-scale by a Low Tern serature Inverse Micelle Solvothermal Route", Nanotechnology (2005).

Yang, R.G., et al., "Multistage Thermoelectric Micro Coolers," Journal of Applied Physics, vol. 95, Jun. 15, pp. 8226-8232 (2004).

Yang, R.G., et al., "Transient Response of Thermoelectric Coolers and Its Applications for Microdevices," Energy Conversion and Management, 46, pp. 1407-1421 (2005).

Yao, D.j., et al., "Low Temperature Eutectic Bonding for In-Plane Type Micro Thermoelectric Cooler," Int. Mechanical Engineering Congress and Exposition, IMECE2001/MEMS-23901 (2001).

Min, et al., "Integrated thin film thermoelectric cooler", vol. 34, No. 2, Electronics Letters, Jan. 22, 1998.

Lindler, Use of Multi-Stage Cascades to Improve Performance of Thermoelectric Heat Pumps, Energy Convers. Mgmt. vol. 30, No. 10, pp. 1009-1014, 1998.

Xuan, et al., "The maximum temperature difference and polar characteristic of two-stage thermoelectric coolers," Cryogenics 42 (2002) 273-278.

Cowling, P. W. et al., "Development of a modified cascade thermoelectric heat pump" Energy Conversion, vol. 9, No. 3, Aug. 1, 1969, pp. 107-117, XPO23602394 ISSN 0013-7480 [retrieved on Aug. 1, 1969] figures 1,6.

Yang Ronggui et al., "Multistage thermoelectric microcoolers" Journal of Applied Physics. New York, US, vol. 95, No. 12, Jun. 15, 2004, pp. 8226-8232, XP012067202 ISSN: 0021-8979.

Partial International Search Report for PCT/US2008/052305 dated Mar. 12, 2009.

International Search Report for PCT/US2008/052305 dated May 20, 2009.

* cited by examiner

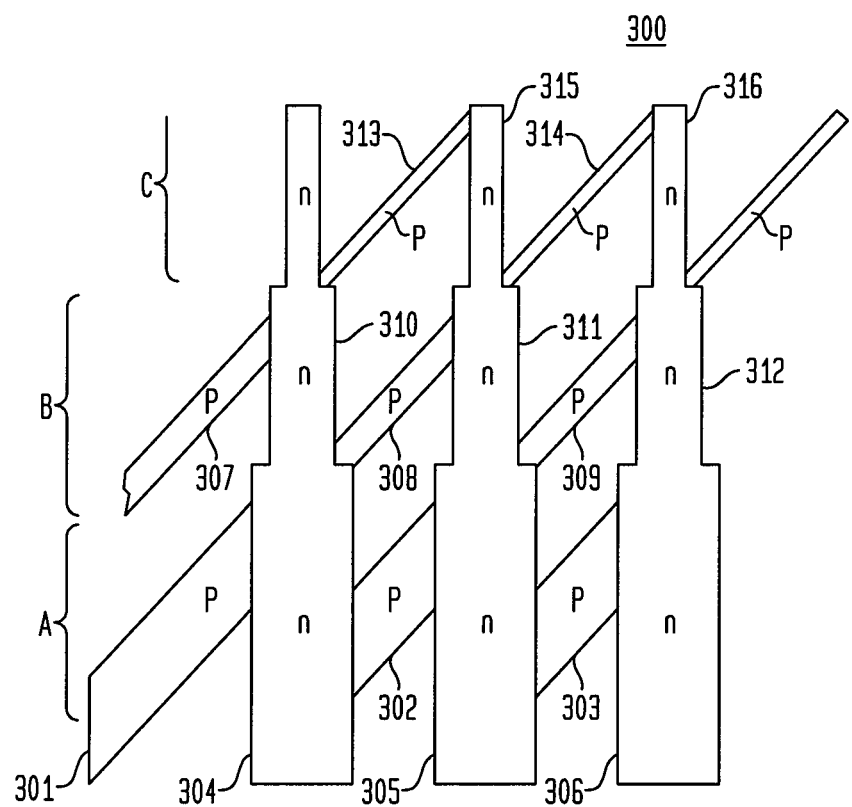

MULTISTAGE THICK FILM THERMOELECTRIC DEVICES

BACKGROUND

The present invention is generally directed to multistage thermoelectric devices, and more particularly, to thick-film based multistage thermoelectric micro-coolers.

In a typical thermoelectric cooling device, a current of electrons flows from a p-type semiconductor material to an n-type material. During this transition at least some of the electrons will increase their energy state by absorbing thermal energy. This increased energy is lost as heat as the current flows through a subsequent conductor or converse junction. The net result is a temperature gradient that can extract heat from an object to be cooled.

Current thermal-mechanical cooling devices, such as Stirling coolers and Joule-Thompson coolers, typically exhibit a significant reduction in their efficiency as their sizes decrease. As such, these devices—though relatively efficient at macroscale—are difficult to scale down to micro-scale sizes. Moreover, the large sizes of conventional commercially available multistage thermoelectric coolers—which are typically formed by vertical stacking of a series of individual thermoelectric coolers—limit their efficiency and the types of applications for which they are suited. In addition, such multistage coolers are generally fabricated by utilizing cumbersome serial—and often manual—assembly processes.

Accordingly, there is a need for enhanced cooling devices, especially for generating cryogenic temperatures. In particular, there is a need for better multistage thermoelectric coolers, and more efficient methods for their fabrication.

SUMMARY

In one aspect, the present invention provides a multistage thermoelectric cooler, which comprises at least two thermoelectric cooling stages, each of which includes a p-type element and an n-type element that are coupled so as to form a p-n junction, where each element can be characterized by a length (L) and a cross-sectional area (A). The p-n junctions of the two stages are thermally and electrically coupled such that at least a portion of a current flowing, during operation of the cooler, through one stage is coupled to the other. Further, at least one of the p or n-type elements forms a unitary thermoelectric structure that spans more than one stage.

The cooler can include one or more electrodes electrically coupled to at least one of the stages for supplying a current to the cooler. In many embodiments, a single current injection is utilized with the p-n junctions connecting the cascading stages to one another allowing a portion of a current flowing in one stage to be coupled into a subsequent stage.

In another aspect, the individual p and n-type elements are configured as legs to span the multiple stages such that different portions of a leg correspond to different cooling stages. The dimensions of the legs can vary when one stage dissipates more heat than the other. In some cases, the cross-sectional area of a leg can vary from one stage to another. In other cases, a ratio of length to cross-sectional area (L/A) associated with one of the p or n-type leg portion of one stage is different than a corresponding ratio associated with a respective p or n-type leg portion of the other stage. By way of example, this difference in the length to cross-sectional area can be selected to accommodate the different heat dissipation in the two stages. For example, the ratio can be less for the stage exhibiting a higher heat dissipation. Tailoring of the area or the aspect ratio may also be desirable to balance current division or to ensure that each stage operates at its optimal current.

In yet another aspect, in the above thermoelectric cooler, the p and n-type elements of at least two of the cooling stages are disposed in a common plane. In other cases, the p-type elements are disposed in one plane and the n-type elements are disposed in a separate plane, e.g., a substantially parallel plane.

In other aspect, a thermoelectric cooling device is disclosed that includes a plurality of multistage thermoelectric coolers coupled between a cold platform and a hot stage so as to pump heat, in parallel, from the platform to the stage. The thermoelectric coolers are angularly distributed around the platform. Each thermoelectric cooler comprises at least two cascading cooling stages that are thermally and electrically coupled to one another.

In a related aspect, in the above thermoelectric device, the platform is substantially transparent to electromagnetic radiation having wavelengths in a selected range. Further, in some cases, one or more of the thermoelectric coolers exhibit a planar configuration (i.e., their p- and n-type legs are disposed in substantially common plane).

In another aspect, the invention provides a multistage thermoelectric cooler, which comprises at least two legs one of which is formed of a p-type and the other of an n-type thermoelectric material. Each of the legs has a first portion across which a first temperature gradient is generated and a second portion across which a second temperature gradient is generated, where the leg forms a contiguous thermoelectric structure. Further, the p- and n-type legs are bonded to one another so as to form an electrically and thermally conductive contact junction.

In a related aspect, in the above thermoelectric cooler, each of the p-type and the n-type legs has a thickness in a range of about 1 micron to about 1 millimeter, and a length in a range of about 20 microns to about 1 millimeter. In some cases, the different portions of at least one of the legs corresponding to different cooling stages have different lengths. Further, in some embodiments, two or more leg portions corresponding to the same cooling stage can have different lengths. Further, in some cases, one portion of each leg corresponding to one of the cooling stages has a thickness different than that of the other portion of that leg corresponding to the other cooling stage.

In another aspect, the thermoelectric cooler comprises a platform that is thermally coupled to the contact junction to be maintained at a low temperature. In some cases, the platform is substantially transparent to electromagnetic radiation having one or more selected wavelength components, e.g., in the infrared portion of the electromagnetic spectrum. Further, in some embodiments, at least a portion of a housing in which the multistage cooler is disposed is transparent to radiation within a selected wavelength range, e.g., to allow the radiation to reach a photodetector that is cooled by the cooler. In many cases, the multistage cooler is packaged in vacuum, or in an inert gas, although packaging in vacuum is preferred as it minimizes the conduction heat loss.

In yet another aspect, the thermoelectric cooler comprises a support substrate that is adapted for mechanically coupling to at least one of those legs. In some cases, the support substrate can comprise a peripheral portion surrounding a central portion, where the heat is transferred from the central portion to the peripheral portion. In some cases, the thermoelectric cooler includes electrical leads disposed at the support's peripheral portion for applying a current thereto.

In other aspect, a multistage thermoelectric cooler is disclosed that includes a plurality of legs formed of a p-type thermoelectric material and a plurality of legs formed of an n-type thermoelectric material, wherein the p-type and the n-type legs are thermally and electrically linked in a cross-bar configuration. Further, the thermoelectric legs are disposed on a common plane.

In another aspect, a multistage thermoelectric cooler is disclosed that includes at least first and second thermoelectric cooling stages comprising at least one p-type thermoelectric leg and one n-type thermoelectric leg coupled to one another so as to form a p-n junction, where each leg spans both stages such that a first portion of each leg that extends from one end thereof to the p-n junction belongs to one stage and another portion of that leg that extends from the p-n junction to another end thereof belongs to the other stage. In some cases, the p-n junction comprises a p-doped material and n-doped material that are linked via a metallic layer that is disposed between them.

In a related aspect, a first temperature gradient develops across the first portions of the legs and a second temperature gradient develops across the second portions of the legs during operation of the cooler.

The multistage thermoelectric coolers of the invention, such as those discussed above can be utilized to form hybrid thermoelectric devices which include several thermoelectric coolers that are thermally coupled to one another. For example, in some embodiments, such a hybrid device can include a conventional thermoelectric cooler that provides one cooling stage, which is coupled to a multistage thermoelectric cooler according to the teachings of the invention that provides additional cooling stages. In other embodiments, two or more of the multistage thermoelectric coolers of the invention can be employed in a hybrid device to provide, via thermal coupling to one another, multiple cooling stages.

In another aspect, a method of fabricating a multistage thermoelectric cooler is disclosed, which comprises forming two templates each having a plurality of channels therein, and filling the channels of one of the templates with a p-type thermoelectric material and those of the other with an n-type thermoelectric material so as to form p and n-type legs having shapes of those channels. The templates are bonded together so as to form contacts (electrical and thermal) between the p-type and n-type legs in a cross-bar configuration pattern. In some cases, the channels have a length in a range of about 20 microns to about 1 millimeter, a width in a range of about 20 microns to about 1 millimeter, and a depth in a range of about 1 micron to about 1 millimeter.

In a related aspect, the filling step comprises pressing the thermoelectric materials into the channels while in a molten state. In some cases, the above fabrication method further calls for electrodepositing Ohmic contacts on a portion of any of the p-type or n-type legs, e.g., prior to the bonding step. Subsequent to the bonding step, the templates can be removed so as to release the bonded p and n-type legs as a multistage cooler.

In another aspect, a method of fabricating a multistage thermoelectric cooler is disclosed that includes depositing a layer of a thermoelectric material on a substrate, forming a patterned mask on the thermoelectric layer to provide exposed and unexposed portions of that layer. This is followed by implanting or diffusing dopant ions of a p- or n-type in the exposed portions to generate p- or n-type thermoelectric legs of the cooler. Subsequently, the patterned mask is replaced with another to cover portions of the thermoelectric layer in which those legs are formed and leave selected other portions of that layer exposed. This can be followed by implanting or diffusing dopant ions of a different type in those exposed portions to form legs of a different dopant type in that layer. The mask can be removed and those portions of the thermoelectric layer not subjected to ion implantation can be etched away so as to generate the thermoelectric cooler.

Further understanding of the invention can be obtained with reference to the following detailed description in conjunction with the associated drawings, which are described briefly below.

DETAILED DESCRIPTION

Figure 1A:
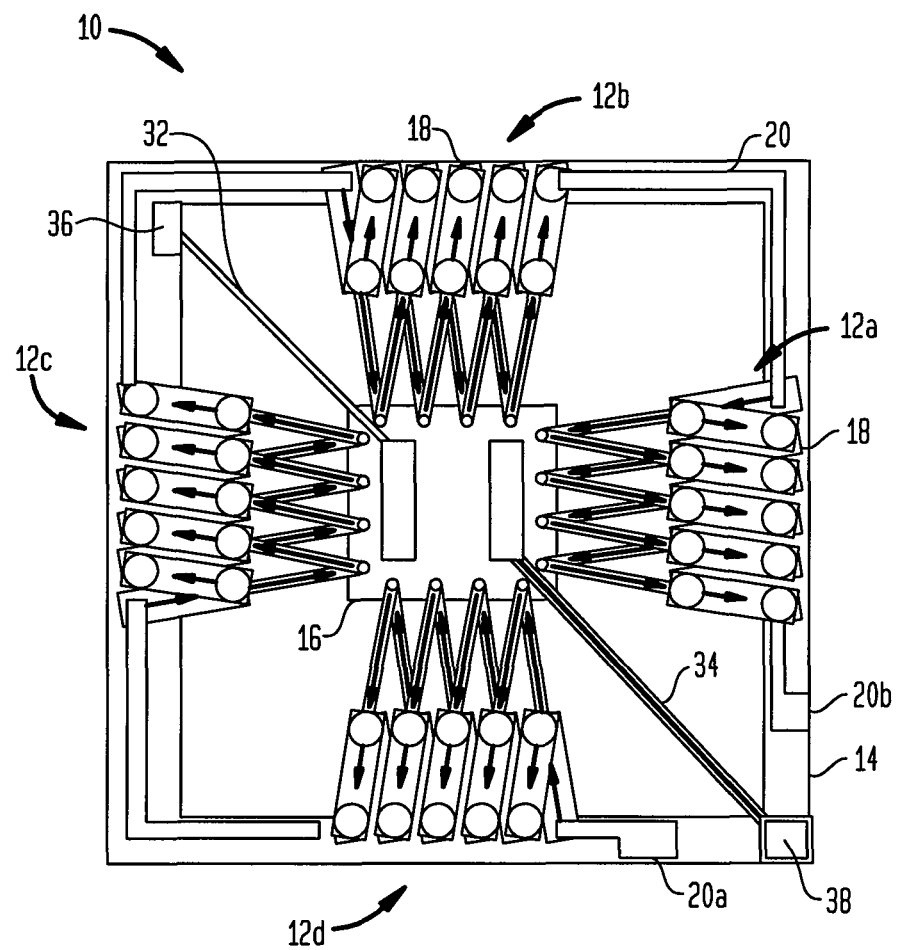
FIG. 1A schematically depicts a top view of a multistage thermoelectric micro cooler device in accordance with one embodiment of the invention, FIG. 1B schematically depicts a perspective view of the device of FIG. 1A, FIG. 2 schematically illustrates one of the multistage thermoelectric micro coolers of the device of FIGS. 1A and 1B.
Figure 1B:
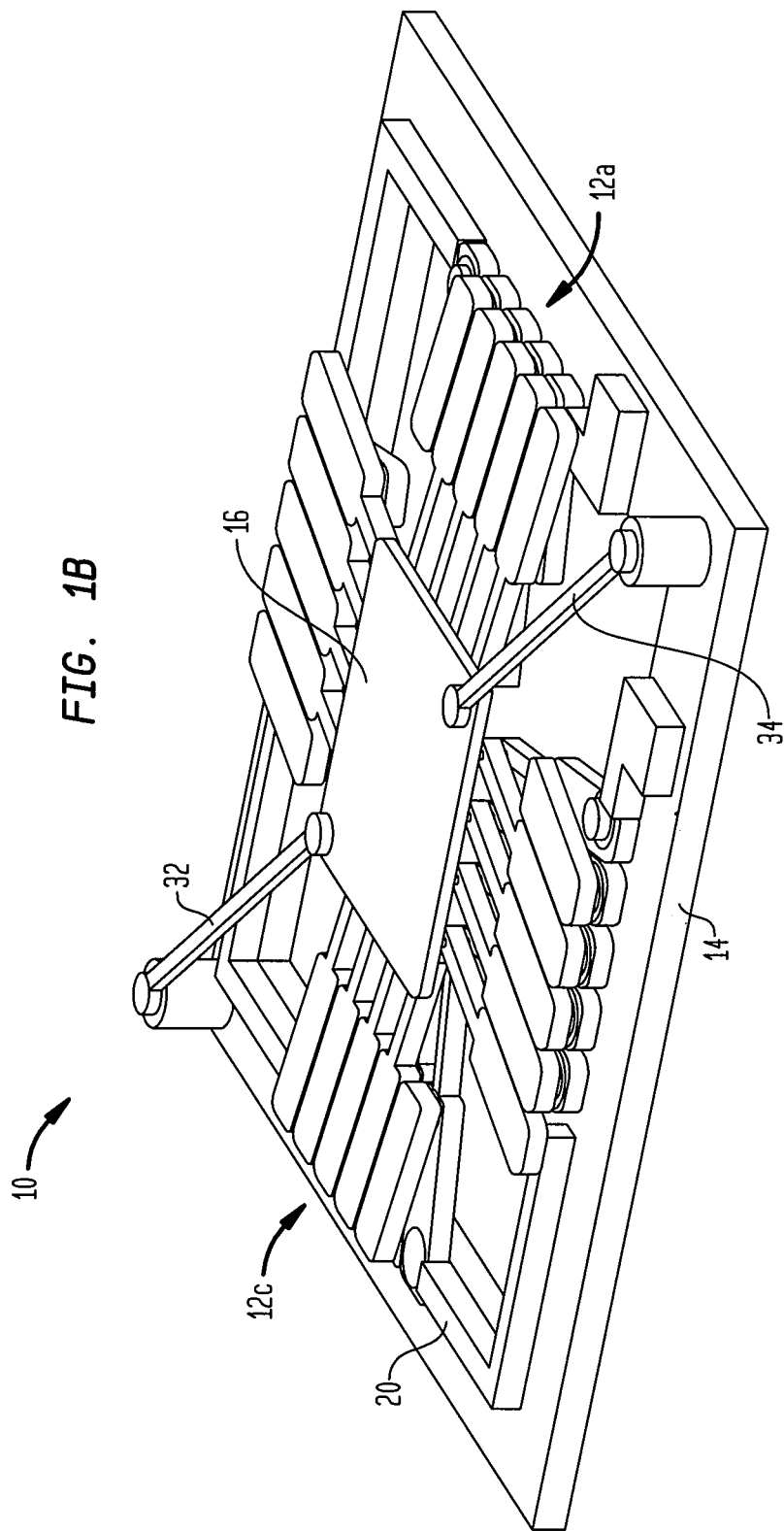

With reference to FIGS. 1A and 1B, a multistage thermoelectric device 10 according to one illustrative embodiment of the invention comprises four multistage micro cryogenic coolers (MTMCC) 12a, 12b, 12c and 12d, herein collectively referred to as multistage coolers 12, that are disposed in a radial configuration on an underlying support substrate 14. Although this embodiment includes four multistage coolers, the number of such stages in other embodiments can be more or less (e.g., 3, 5, or other numbers) depending, e.g., on particular applications and design. As discussed in more detail below, each multistage cooler 12 generates a temperature differential, via two cooling stages, between a cold platform (island) 16 and a peripheral portion 18 of the device. In this embodiment, the four multistage coolers are connected electrically in series via an electrical lead 20 disposed on the support substrate 14. A voltage differential can be applied across two ends 20a and 20b of the lead 20 to cause a current flow through the multistage coolers 12. In some other embodiments, the coolers can also be electrically connected in parallel, or a combination of parallel and serial connections can be employed.

Each multistage cooler 12 is formed of p-type and n-type legs that are bonded together in a cross-bar configuration, as discussed further below. The n and p-type legs can be formed of suitable thermoelectric materials doped with appropriate electron donors or acceptors. For example, in this exemplary embodiment, $Bi_2Ti_3$-based alloys are utilized as the thermoelectric materials. Other examples of suitable thermoelectric materials comprise, without limitation, PbTe, PbSe, Si, Ge, and superlattices, as well as any other suitable thermoelectric material. In many embodiments, the thermoelectric material can be characterized by a dimensionless figure-of-merit (ZT) greater than about 0.4 (e.g., in a range of about 0.4 to about 3), where $$Z = \frac{S^2 \sigma}{k}$$

(S is the Seebeck coefficient, $\sigma$ is the electrical conductivity, and k is the thermal conductivity), and T can be the average operating temperature. Some examples of thermoelectric materials suitable for use in the practice of the invention are described in U.S. patent application Ser. No. 10/977,363 entitled "Nanocomposites with high thermoelectric figures of merit," filed on Oct. 29, 2004, which is herein incorporated by reference.

Figure 2:
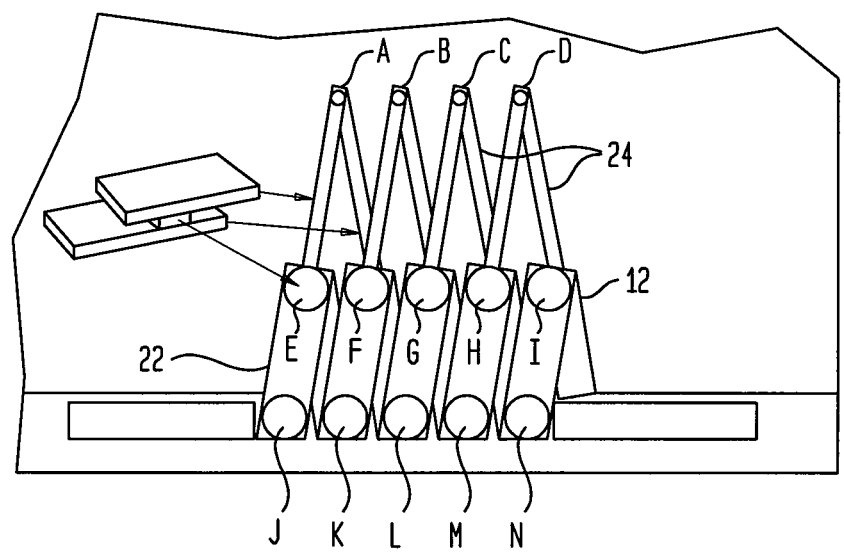

In this exemplary embodiment, each multistage micro cooler 12 is formed of a plurality of thermoelectric legs. By way of example, FIG. 2 schematically shows one of the multistage micro coolers 12 that includes a plurality of p-type legs 22 and n-type legs 24, each of which comprises a unitary continuous thermoelectric structure having two contiguous portions with different widths. In other words, each leg is formed as a unitary structure that spans the two cooling stages. That is, the different portions of each leg remain a physically undivided structure (which in many embodiments is formed of substantially the same material composition throughout).

Figure 3:
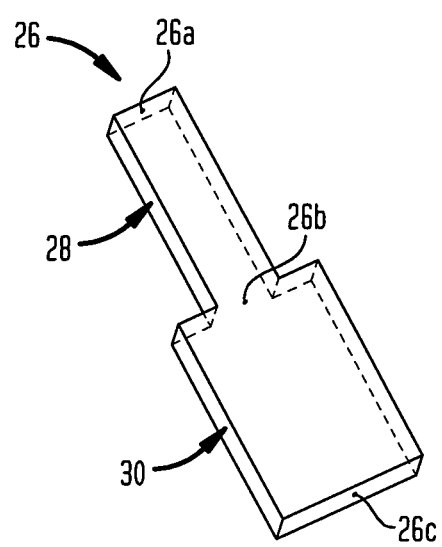
FIG. 3 is a schematic perspective view of a thermoelectric leg of the multistage thermoelectric micro cooler of FIG. 2.

FIG. 3 schematically depicts one such leg 26 having a first portion 28, extending between first end 26a and second end 26b, across which a first temperature gradient is generated during operation of the device and a second portion 30 that is contiguous with the first segment and extends between the second end 26b and a third end 26c. A second temperature gradient is generated across the second portion 30. The first temperature difference corresponds to a first stage of cooling while the second temperature difference corresponds to a second cooling stage, with the combined difference representing the total cooling provided by the device. In other embodiments, rather than forming a unitary structure, the two portions of at least one leg are formed of separate structures that are thermally and electrically linked together (e.g., via metallic interconnects).

Referring again to FIG. 2, in this exemplary embodiment, in each multistage micro cooler 12, the p and n-type legs are disposed on separate planes that are substantially parallel to one another. Other embodiments can employ other arrangements of the p and n-type legs, e.g., they can be disposed in the same plane as discussed below. Further, in this exemplary embodiment, the p and n-type legs are bonded with one another at electrically and thermally conductive junctions in a cross-bar configuration.

Figure 4A:
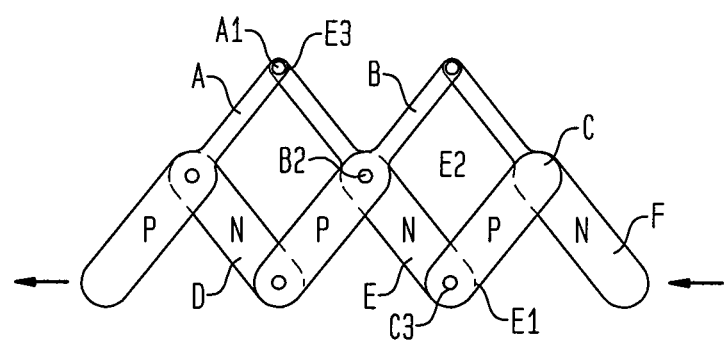
FIG. 4A is a schematically depicts connectivity of the p-type and one n-type thermoelectric legs of the multistage thermoelectric micro coolers of the device shown in FIGS. 1A and 1B.
Figure 4B:
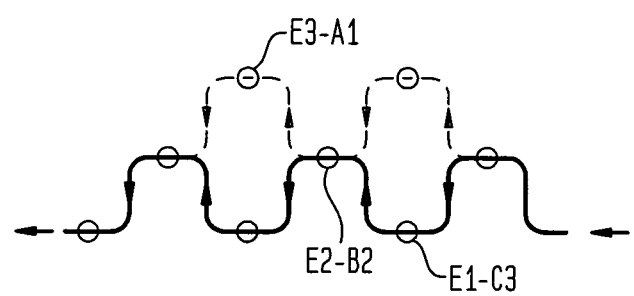
FIG. 4B is a schematic current flow diagram for the configuration of thermoelectric elements shown in FIG. 4A, FIG. 4C schematically depicts the connectivity of p and n-type legs of one embodiment of a multi-stage thermoelectric cooler according to the teachings of the invention, FIG. 5A schematically depicts a multistage thermoelectric cooler according to one embodiment of the invention in which the p and n-type legs of the cooling stages are disposed in substantially the same plane, FIG. 5B schematically shows the configuration of two stages of a planar multistage thermoelectric cooler according to another embodiment of the invention, FIG. 5C schematically depicts another embodiment of a planar multistage thermoelectric cooler according to the teachings of the invention, FIG. 5D schematically depicts a multistage thermoelectric cooler according to another embodiment of the invention in which the p and n-type legs of each stage are disposed in separate and substantially parallel planes, FIG. 6A schematically illustrates a hybrid miniature and micro thermoelectric cooler according to one illustrative embodiment of the invention, FIG. 6B schematically depicts a portion of a multistage thermoelectric cooler according to another embodiment of the invention having three cascading cooling stages, FIGS. 7A-7H schematically depict various stages in an exemplary microfabrication method for generating a multistage thermoelectric micro cooler device in accordance with one embodiment of the invention.

This cross-bar configuration pattern can be perhaps better understood by reference to FIG. 4A, which shows three p-type legs (designated in this figure as A, B, and C), and three n-type legs (D, E, and F) that span across the p-type legs. More specifically, the n-type leg E forms contact junctions at first, second and third locations thereof (herein designated as E1, E2 and E3) with first, second and third locations (A1, B2, C3) of the legs A, B, and C, respectively. Similar connectivity can be observed for many of the p-type legs relative to three n-type legs. As discussed below, current division occurs at each of such p-n contact junctions. The term "p-n junction" or "contact junction," as used herein, refers not only to a junction made by direct contact between a p-type material and an n-type material but also to a junction made by a p-type material and an n-type material linked via a conductive layer, such as a metal layer. By way of example, the latter type of junction can have the following form: p-type material—metal—n-type material. FIG. 4B is a schematic current flow diagram for the configuration shown in FIG. 4A.

More specifically, referring again to FIG. 1A, the current flow and its division at various p-n junctions in each of the multistage micro coolers 12 are schematically illustrated by a plurality of arrows. In each multistage cooler, the portions of the p and n-type legs having smaller widths collectively form the first stage of thermoelectric cooling, and those portions of the p and n-legs having larger widths collectively form the second stage of thermoelectric cooling. By way of example, in the thermoelectric cooler shown in FIG. 2, the first thermoelectric cooling stage generates a temperature gradient (differential) between the contact junctions A, B, C, and D at the inner portion of the device (herein also referred to as 'cold junctions' or 'cold ends') and intermediate contact junctions E, F, G, H and I (herein also referred to as 'intermediate-temperature junctions' or 'intermediate-temperature ends'). The second thermoelectric cooling stage, in turn, generates a temperature gradient between the intermediate-temperature junctions and outer contact junctions J, K, L, M and N (herein also referred to as 'hot junctions' or 'hot ends'). In this convention, the thermoelectric cooling stage that is closer to the cold platform is referred to as the first stage and the other cooling stage is referred to as the second stage.

In general, the dimensions of p and n-type legs of thermoelectric micro coolers of the invention can be selected to suit a particular application. By way of example, in many embodiments, the legs have lengths in a range of about 20 microns to about 1 millimeter (mm), widths in a range of about 20 microns to about 1 mm, and thicknesses in a range about 1 micron to about 1 mm. While in some embodiments, such as that described above, the legs can exhibit varying widths and/or lengths corresponding to portions associated with different thermoelectric stages, in other embodiments, they can have uniform widths.

Utilizing thicker legs (e.g., in a range of about 5 microns to about 1 mm) can advantageously limit heat loss via radiation to within a few percent of the intrinsic heat conduction loss through the thermoelectric legs. In addition, thicker legs are structurally more robust, thereby minimizing, and in some cases entirely eliminating, the need for supporting films. This in turn ameliorates, and preferably eliminates, parasitic heat conduction losses that could occur via such supporting films.

In addition, in many embodiments, rather than utilizing conventional interconnects such as gold wires, one or more interconnects between the cold region (e.g., the above cold platform 16) of a multistage thermoelectric device of the invention and the external environment can be made of thermoelectric materials so as to eliminate heat loss that is typically associated with conventional interconnects. Such heat loss can indeed be significant. For example, the heat loss from a conventional bonding wire can reach 100 mW. Further, in many embodiments, the multistage thermoelectric micro cooler is sufficiently robust that electrical connections to the devices-to-be-cooled can be made on the cooler's cold island itself, while the thermoelectric interconnects can be used as leads. In the case of large current flows to the device, the thermoelectric interconnects themselves create additional cooling effect that, in turn, contributes to the device cooling.

For example, referring again to FIGS. 1A and 1B, in the above illustrative multistage thermoelectric device 10, interconnects 32 and 34 that connect the cold region 16 to thermally conductive pads 36 and 38, respectively, are themselves formed of $Bi_2Ti_3$-based alloys.

In some embodiments, the cold platform 16 is formed of a material (e.g., glass or silicon) that is substantially transparent to electromagnetic radiation having one or more selected wavelength components (e.g., radiation in the infrared (IR) range of the spectrum).

Figure 4C:
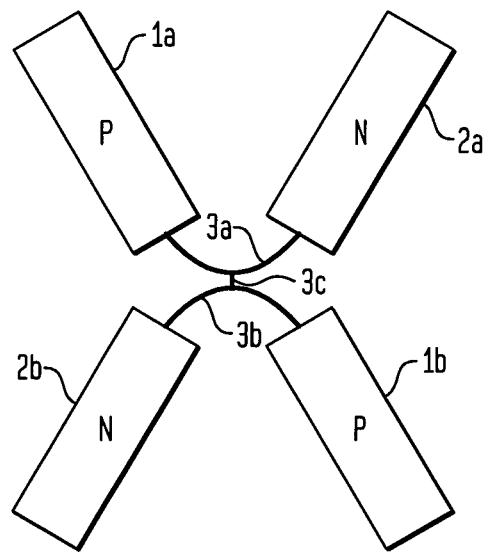

With reference to FIG. 4C, in some embodiments, the first thermoelectric cooling stage includes at least one p-type thermoelectric segment 1a and an n-type segment 2a that form a p-n junction, e.g., via an electrically conducting path 3a. Similarly, the second thermoelectric cooling stage includes at least one p-type thermoelectric segment 1b and an n-type segment 2b that form a p-n junction, e.g., via an electrically conducting path 3b. The p-n junctions are electrically coupled, e.g., via an electrically conductive path 3c, so as to allow division of a current—flowing through the device during its operation—between the first and the second cooling stages.

Figure 5A:
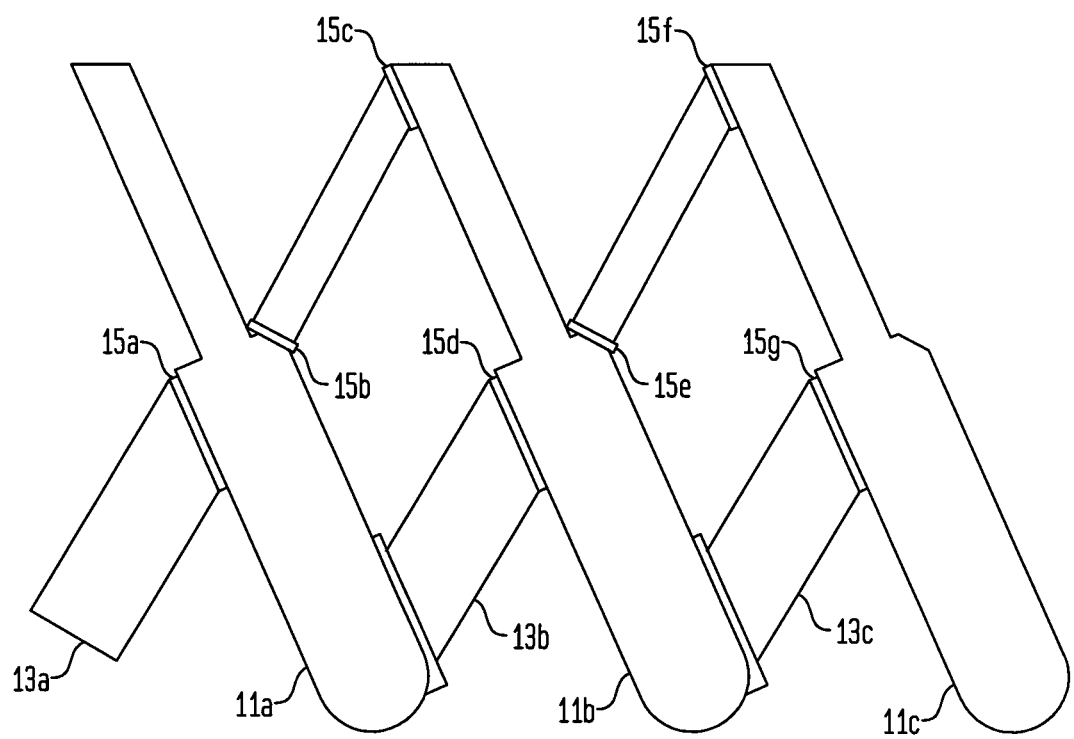

In some embodiments, the p and n-type legs that provide a cascade of theremoelectric cooling stages are disposed in the same plane. By way of example, FIG. 5A schematically depicts a plurality of p-type legs 11a, 11b, 11c and n-type legs 13a, 13b and 13c that are arranged in a cross-bar configuration to provide primary and secondary thermoelectric stages, e.g., in a manner discussed above, of a micro-cooler. The n and p-type legs are linked by interconnections 15a-15g, which can be formed, e.g., of various metals, including alloys. In many embodiments, the leg portions forming the second stage are shorter than those forming the first cooling stage. In this exemplary embodiment, the p- and n-type legs are disposed in a common plane. In other words, the legs exhibit a vertical displacement relative to one another (i.e., a displacement in a direction perpendicular to the plane of the legs) that is less than about an average thickness of the legs. Further, in this embodiment, each of the legs 11a, 11b and 11c is formed as a unitary thermoelectric structure that spans both cooling stages.

Figure 5B:
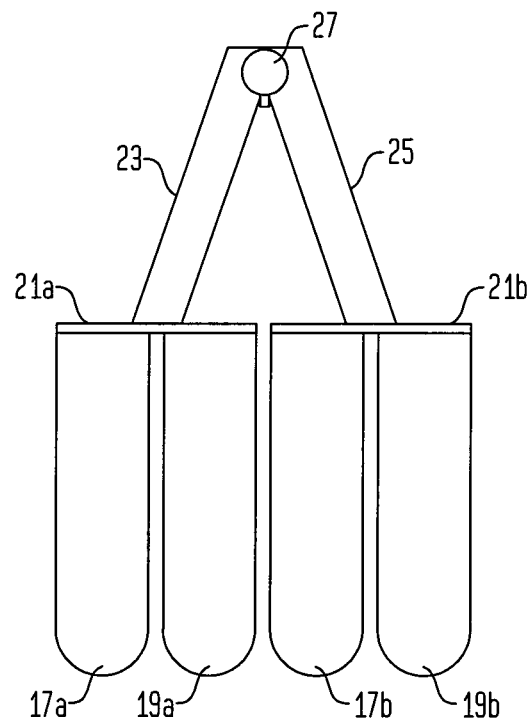

FIG. 5B shows another configuration of two stages of a planar thermoelectric cooler. More specifically, a plurality of p-type thermoelectric legs 17a and 17b, and n-type thermoelectric legs 19a and 19b, forming two p-n junctions via conductive (e.g., metallic) linkages 21a and 21b, form one cooling stage, and p-type leg 23 and n-type leg 25, connected via a conductive (e.g., metallic) linkage 27, form another cooling stage. Similar to the embodiment of FIG. 5A, all of the p and n-type legs of the two stages are disposed in substantially the same plane.

Figure 5C:
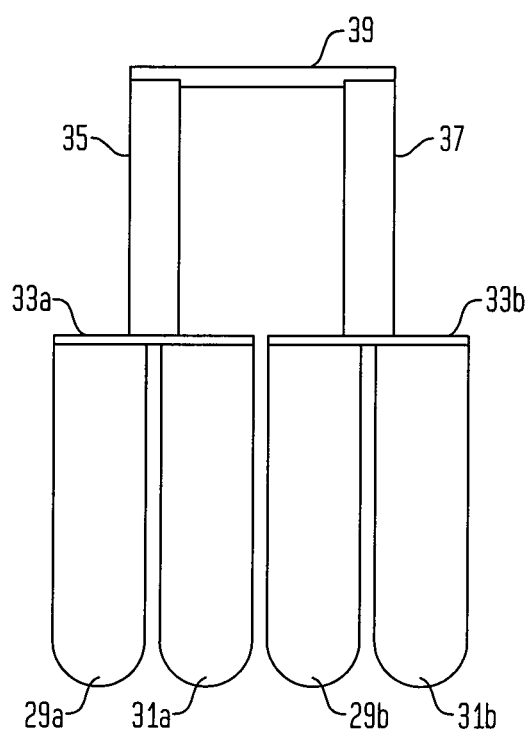

By way of another example, FIG. 5C shows another embodiment of a planar multistage thermoelectric cooler of the invention that includes a plurality of p-type legs 29a, 29b, and n-type legs 31a and 31b, which form two p-n junctions via conductive linkages 33a and 33b, comprise one cooling stage. Another cooling stage comprises p-type leg 35 and n-type leg 37, connected via an electrically conductive linkage 39 to form a p-n junction. In this embodiment, the conductive (e.g., metallic linkage) 39 provides a flat surface to which devices to be cooled can be thermally coupled. Similar to the embodiments of FIGS. 5B and 5C, the p and n-type legs of the two cooling stages in this embodiment are also disposed substantially within the same plane.

Figure 5D:
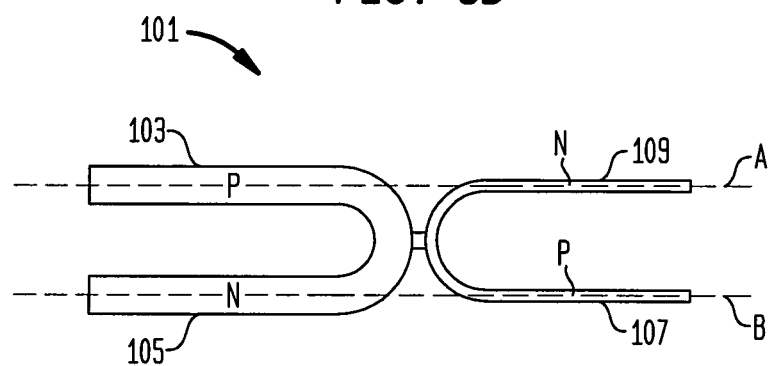

In some embodiments, the p and n-type legs of a thermoelectric cooling stage are disposed on separate (e.g., parallel) planes. For example, at least a portion of a leg disposed in one plane is parallel with a portion of a leg disposed in the other plane. By way of example, FIG. 5D schematically depicts two cooling stages of a multi-stage thermoelectric cooler 101 in which a p-type leg 103 and an n-type leg 105, connected to form a p-n junction, comprise one cooling stage and a p-type leg 107 and an n-type leg 109, also connected to form a p-n junction that is in thermal and electrical contact with the p-n junction formed by the legs 103 and 105, comprise another cooling stage. As used herein, two structures are in "thermal contact" or are "thermally coupled" if heat energy can flow between them and they are in "electrical contact" or are "electrically coupled" if electrical energy (e.g., in the form of an electrical current) can flow between them. In some embodiments, two structures that are in thermal contact are coupled via a thermally conductive path characterized by a thermal conductance that is at least about 10 times, and preferably about 100 times, greater than the thermal conductance of the structures it is connecting, and two structures that are in electrical contact are coupled via an electrically conductive path characterized by an electrical conductance that is at least about 10 times, and preferably about 100 times, greater than the electrical conductance of the structures it is connecting. While both of the p-type leg 103 and n-type leg 109 of the two stages are disposed substantially in one plane (schematically depicted as plane A), both of the n-type leg 105 and p-type leg 107 are disposed in a separate (in this case substantially parallel) plane (schematically depicted as plane B). In other words, the p-type and n-type legs of each cooling stage are disposed in substantially parallel plane.

Figure 6A:
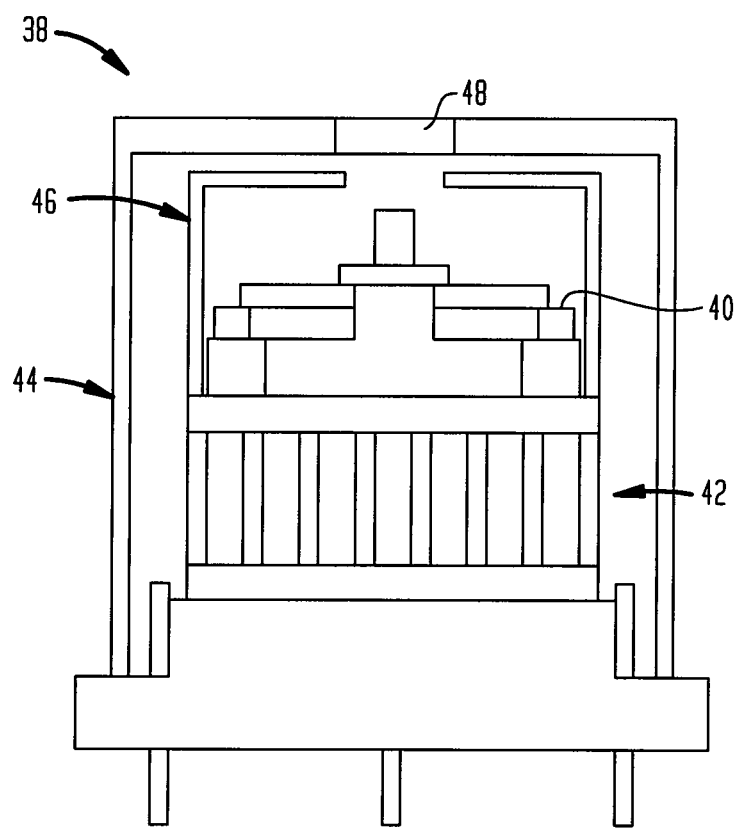

With reference to FIG. 6A, in another embodiment, a hybrid miniature and micro thermoelectric cooler 38 is provided by coupling a multistage thermoelectric micro cryogenic cooler 40 according to the teachings of the invention, such as that described above, to a miniature thermoelectric (TE) cooler 42. Miniature TE coolers suitable for use in this embodiment of the invention are commercially available. The hybrid thermoelectric cooler can be disposed in a hermetically sealed housing 44, in a manner known in the art. Further, a thermal shield 46 can be disposed between the miniature cooler and the MTMCC to minimize radiation loss. In this embodiment, a window 48 (e.g., one that is transparent to selected radiation wavelengths) is coupled to the housing to allow communication with a target device that is thermally coupled to the MTMCC stage to be cooled. For example, the target device can be a radiation detector, e.g., an infrared detector, that is maintained at a cryogenic temperature by the hybrid cooler to detect radiation incident thereon through the window 48. As the MTMCC can be made to have a small size, the vertical integration of the MTMCC and the miniature cooler depicted in this embodiment can lead to a hybrid device having a height that is only slightly greater than that of the miniature cooler component (e.g., it could be greater by about 0.5 mm).

The thermoelectric micro coolers of the invention provide a number of advantages. By way of example, in the above illustrative thermoelectric device 10 (FIGS. 1A and 1B), the cross-bar geometry of the micro coolers in combination with mechanical robustness of their p and n-type legs impart enhanced structural strength to that device, thereby facilitating attachment of a cooling target directly to the device's cold island 16. This versatility renders the multistage thermoelectric device suitable for thermal coupling to a variety of low-power microdevices to allow their operation in cryogenic temperature regimes. Some examples of such microdevices include, without limitation, IR detectors and lasers, low noise amplifiers, gyroscopes, and various superconducting devices. Another advantage is that all of the cooling stages can be made concurrently.

Further, the multistage thermoelectric micro coolers of the invention can be manufactured so as to have a much smaller volume than that of conventional multistage thermoelectric coolers with comparable cooling capabilities. By way of example, the above exemplary thermoelectric device 10 according to one embodiment of the invention can be manufactured to have a volume of about 0.002 cm$^3$ and the whole package of the above hybrid miniature and micro thermoelectric cooler assembly 38 (excluding power supply) can have a volume of about 0.4 cm$^3$, representing a factor of about 1000 reduction in the cooler size and a factor of about 40 reduction in the system size.

Moreover, unlike conventional multistage coolers that employ a separate current injection for each stage, the multistage thermoelectric micro cryogenic coolers according to the teachings of the invention, such as the above exemplary device 10, can employ a single current injection and rely on current division at electrically conductive junctions formed between the different stages for supplying current from one thermoelectric cooling stage to another. In other words, many embodiments of the thermoelectric devices of the invention do not employ separate electrical leads extending from each stage to an external source or to a next stage, thereby eliminating a significant source of heat loss associated with such leads. For example, unlike many conventional devices that employ wires to connect current leads of one thermoelectric stage to the next, many embodiments of the invention employ contiguous structures, or segmented structures coupled via conductive linkages, that eliminate the need for such wires. The current injection configuration employed in various embodiments of the invention also advantageously minimizes temperature drops at the interfaces of the different thermoelectric stages, which is typically present in conventional bulk devices that employ ceramic plates for stacking different thermoelectric stages.

In some embodiments, the performance of multistage thermoelectric devices of the invention are further enhanced, especially for cryogenic applications, by optimizing the thermoelectric properties of the bulk materials employed for forming the different thermoelectric cooling stages. For example, nanoparticles can be incorporated into the bulk materials to improve their thermoelectric properties, e.g., to achieve enhanced cooling power and lower temperatures. By way of example, nanostructured bulk materials that exhibit lower thermal conductivity than that of their parent materials while having comparable or even lower electrical power factor can be utilized so long as the reduction in the thermal conductivity is more than the reduction in the power factor. Some examples of such materials are disclosed in the aforementioned patent application entitled "Nanocomposites with High Thermoelectric Figures of Merit."

An MTMCC device of the invention can be operated both in steady state mode as well as in a pulsed mode to achieve temperatures as low as 160 K or even lower, e.g., depending on the thermoelectric materials that are employed. In particular, the application of a transient pulse to a multistage thermoelectric cooler according to the teachings of the invention can take advantage of instantaneous heat removal by electrons and slower thermal diffusion processes of Joule heat generated in the thermoelectric legs to further reduce the temperature of the cold region (platform) of the thermoelectric cooler. For example, 10-20 K additional reduction in temperature can be achieved by applying a transient pulse to the last stage of a multistage thermoelectric micro cooler.

The thermoelectric coolers according to the teachings of the invention are not limited to those having only two stages, but can include three or more cascading cooling stages, as a particular application requires. By way of example, FIG. 6B schematically depicts a portion of a planar thermoelectric cooler 300 according to another embodiment of the invention that comprises three cascading thermoelectric cooling stages A, B, and C. The cooling stage A comprises p-type leg portions 301, 302, and 303 forming p-n junctions, respectively, with n-type leg portions 304, 305, and 306. The cooling stage B comprises p-type leg portions 307, 308, and 309 forming p-n junctions, respectively, with n-type leg portions 310, 311, and 312. Further the cooling stage C comprises p-type leg portions 313 and 314 forming p-n junctions, respectively, with n-type leg portions 315, and 316. Each stage is coupled to the next via coupling between their respective p-n junctions. In this embodiment, each n-type leg portion of each stage forms a unitary thermoelectric structure with the respective n-type leg portions of the other two stages. In other words, they form a unitary leg spanning the three stages. For example, the n-type portions 305, 311, and 315 are formed as a unitary thermoelectric structure.

In some embodiments, the multistage thermoelectric micro coolers according to the teachings of the invention, such as those described above, can be manufactured by employing a hot micro-embossing process, or a hot micro-molding process depending on the operational temperature. For example, with reference to FIGS. 7A-7H as well as the flow chart of FIG. 8, in an initial step (A), a template (mold) 48 is fabricated from a suitable substrate (e.g., a semiconductor or a metallic substrate). For example, silicon-based micro molds can be fabricated by deep reactive ion etching of a silicon substrate. Alternatively, nickel-based micro molds can be formed based on electroplating nickel on thick photoresist layers, or LIGA processes that are commonly used in microdevice fabrication. The typical feature sizes of these molds can be larger than about 20 microns (e.g., size of feature corresponding to thermoelectric leg widths) and their aspect ratios can be in a range of about 1-5. Subsequent to fabrication, the surfaces of such micro molds can be treated via, e.g., surfactant so that the molds can be easily removed after micromolding.

The exemplary micro template (mold) 48 has a plurality of channels (trenches) 50 that can be utilized for formation of the p and n-type legs of a multistage thermoelectric cooler of the invention, as discussed in more detail below. More specifically, with reference to FIG. 7B, a suitable thermoelectric material can be pressed (step B), e.g., while in a molten state, into the channels 50. For example, softened $Bi_2Te_3$-based alloys (in case of embossing) or molten $Bi_2Te_3$-based alloys (in case of molding) can be pressed into the micro mold (e.g., via pressure applied by a plate 52). Such alloys typically exhibit a melting point less than about 600° C. The hot embossing (molding) can be carried out in vacuum, e.g., on a hot press. For example, in this exemplary embodiment, n-$Bi_2Te_xSe_{3-x}$, where x can be in a range of about 0 to about 3, can be pressed into the channels of the micro mold 48 while the micro mold is heated on a heated stage. As shown schematically in FIG. 7C, this step can be followed (step C) by polishing the top surface, e.g., via chemical mechanical polishing (CMP), as well as cleaning the polished surface. In this manner, n-type legs are formed within the micro mold.

Figure 7A:
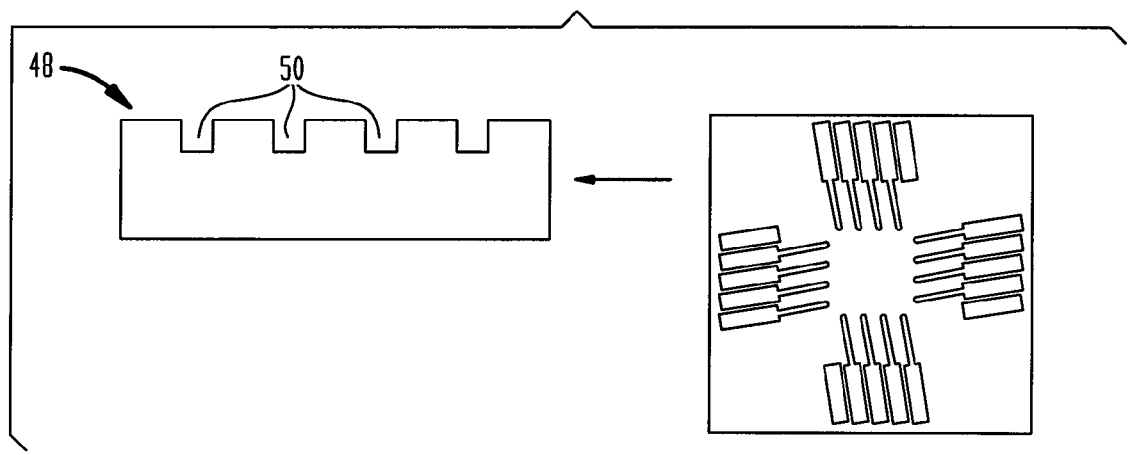
Figure 7B:
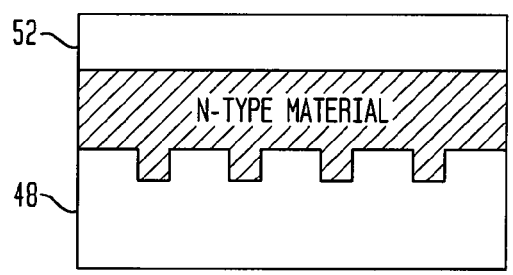
Figure 7C:
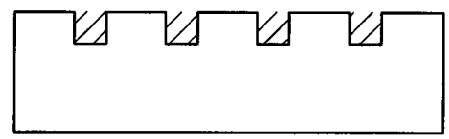
Figure 7D:
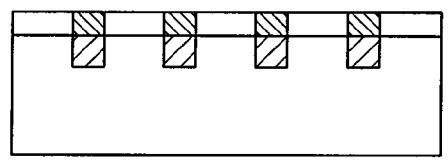
Figure 7E:
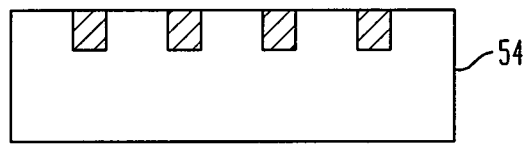
Figure 7F:
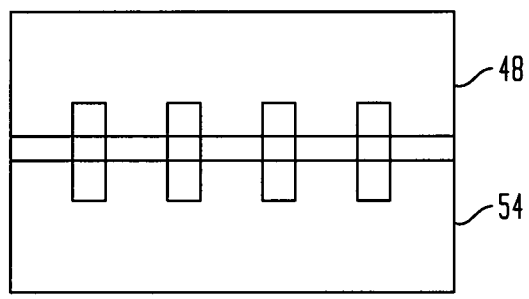
Figure 7G:
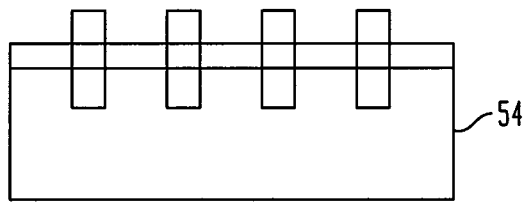
Figure 7H:
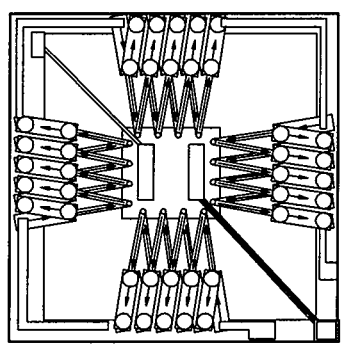
Figure 8:
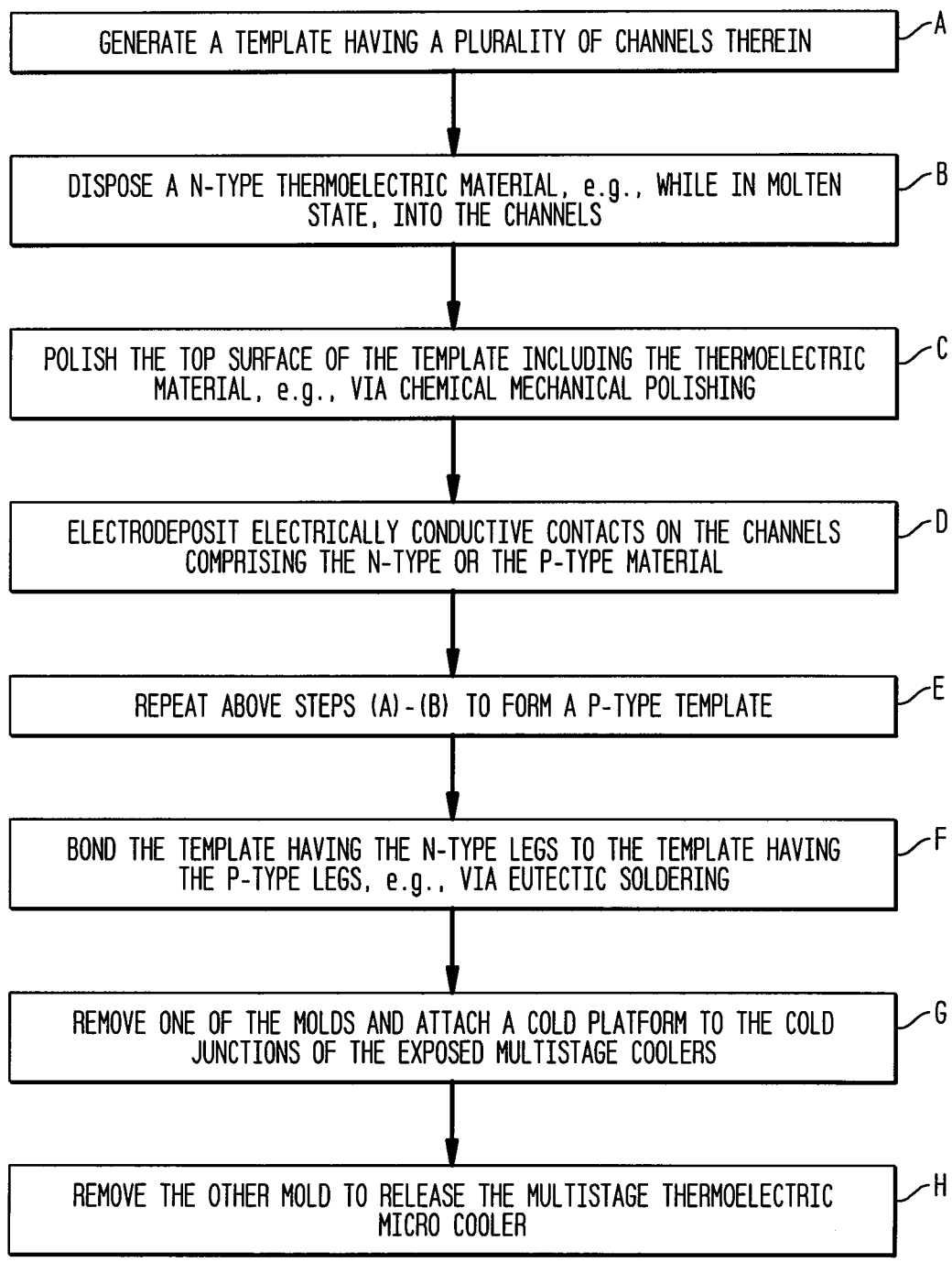
FIG. 8 is a flow chart identifying various stages of the fabrication method illustrated in FIGS. 7A-7H, FIGS. 9A-9F schematically depict various stages in another fabrication method for generating multistage thermoelectric coolers in accordance with some embodiments of the invention, FIG. 10 schematically depicts a planar thermoelectric cooler formed by employing the fabrication methods delineated in FIGS. 9A-9F

Referring to FIG. 7D, in a subsequent step (D), Ohmic contacts, diffusion barriers and/or bonding solder can be electrodeposited on the n-type legs. As shown schematically in FIG. 7E, the above processes can be repeated (step E) to generate p-type legs in another micro mold 54. For example, in this embodiment, p-$Bi_2Sb_xTe_{3-x}$, where x can be in a range of about 0 to about 3, is utilized for generating the p-type legs. In a subsequent step (step F) shown schematically in FIG. 7F, the micro mold containing the n-type legs is bonded to the micro mold containing the p-type legs (e.g., by employing eutectic soldering) so as to form the cross-bar structure of the p and n-type legs of each multistage micro cooler (such as the multistage thermoelectric micro coolers 12 described above). The device bonding step can then be followed by removing the upper mold (step G), attaching a platform (such as the cold platform 16 described above) to the cold junctions of the multistage coolers, and coupling the coolers to a support substrate (FIG. 7G), such as the substrate 14 described above. This can then be followed by removing the bottom mold 54 to generate the multistage thermoelectric micro cooler device structure (step H), shown in FIG. 7H.

In some embodiments, lubricants can be applied to the micro molds so as to facilitate their removal and/or generate reusable molds. For example, sputtering deposition can be employed to coat the mold die with lubricant materials, e.g., graphite or BN. Alternatively, selective etching may be utilized to remove the mold, e.g., by employing KOH that does not attack $Bi_2Te_3$ while it is a common etchant for silicon.

The multistage thermoelectric micro coolers according to the teachings of the invention can advantageously create cryogenic temperature environments selectively at the locations that are essential for a particular device function, thereby enabling a wide range of military and scientific applications, such as IR detectors and lasers, low noise amplifiers, gyroscopes, superconducting devices, and scanning probe microscopes. By way of example, in one application, the multistage thermoelectric micro coolers of the invention (such as the above exemplary micro cooler device 10) can be utilized to cool photodiode IR detectors so as to enhance their responsivity. For example, the responsivity of a Ge detector operating at 300 K peaks at about $10^{11}$ cmHz/W, while it increases to $3 \times 10^{13}$ cmHz/W at 196 K.

Further, in many embodiments, all of the stages of a multistage thermoelectric micro cooler of the invention can be built, e.g., along the plane of a film (in-plane direction), by taking advantage of microfabrication techniques, such as those discussed above. Further, as discussed above, in some embodiments, hybrid systems based on micro-miniature stacking can be formed in which the miniature stage is utilized as the last cooling stage to provide maximum flexibility (e.g., relative to the external environment temperature), as the miniature stage can exhibit a much higher cooling power.

Figure 11:
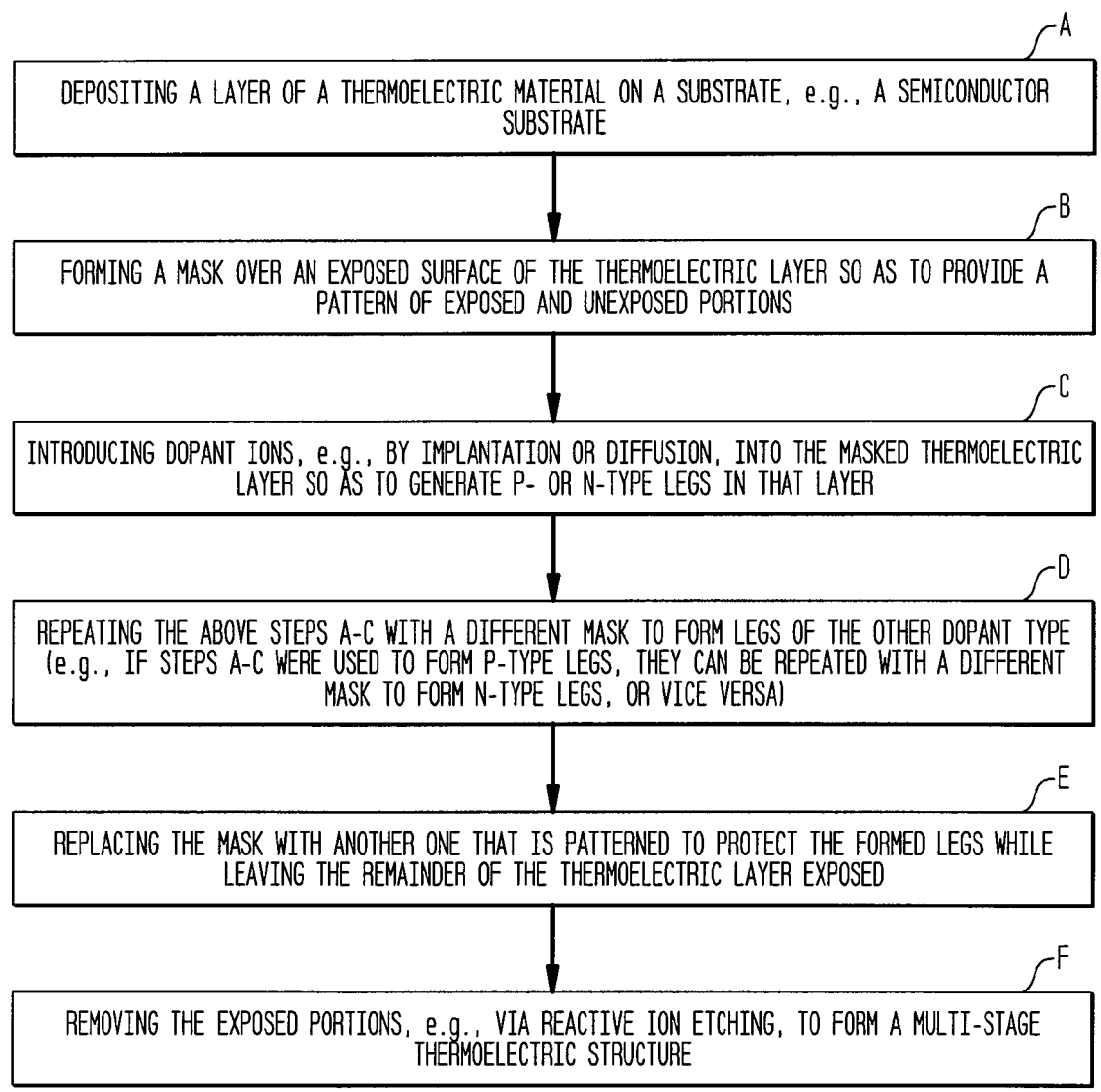
FIG. 11 is a flow chart identifying various stages in the fabrication method illustrated in FIGS. 9A-9F.

With reference to a flow chart of FIG. 11 as well as FIGS. 9A-9F, in one fabrication method according to one embodiment of the invention, a layer of a thermoelectric material 201 is disposed on a suitable substrate 203 (step A), e.g., a semiconductor substrate such as silicon. Subsequently, a patterned mask 205 is formed over the exposed surface of the thermoelectric layer (step B) to generate a pattern of exposed and unexposed portions, where the exposed portions correspond to the desired profiles of the n-type or the p-type legs. The masked thermoelectric layer is then subjected to ion implantation or diffusion by dopant ions, or other suitable techniques, so as to generate p or n-type legs therein (step C). The above steps can be repeated (step D) with a different mask to form legs 209 corresponding to the other dopant type (e.g., if the steps A-C were initially utilized to form the p-type legs, they can be repeated with a different mask to form the n-type legs).

Figure 9A:
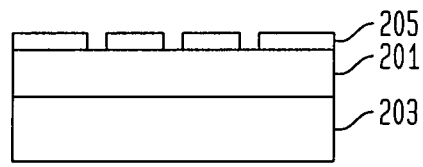
Figure 9B:
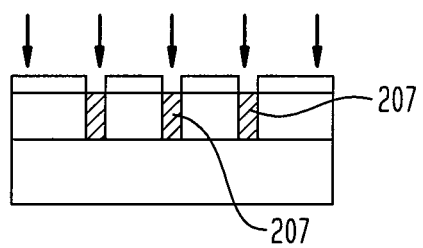
Figure 9C:
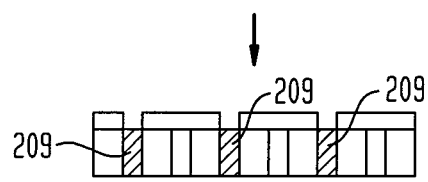
Figure 9D:
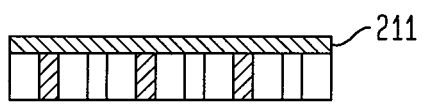
Figure 9E:
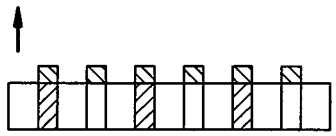
Figure 9F:
Figure 10:
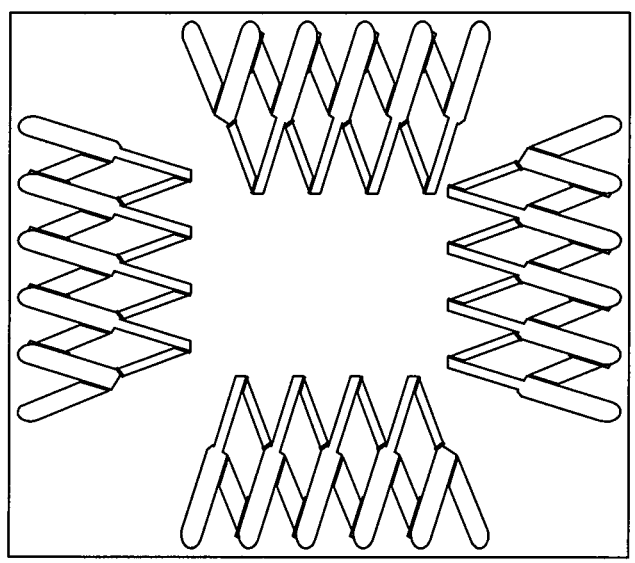

Subsequently, as schematically shown in FIG. 9D, the surface of the thermoelectric layer can be cleaned and another mask 211 can be disposed thereon. The mask 211 can be patterned, e.g., by employing photolithographic techniques, so as to protect the formed legs while leaving the remainder of the thermoelectric layer exposed (FIG. 9E, step E). As shown schematically in FIG. 9F, the exposed portions of the thermoelectric layer can be removed (step F), e.g., by utilizing etching techniques, to form an in-plane multi-stage thermoelectric structure, such as that shown schematically in FIG. 10. The above processing technique can provide certain advantages. For example, it can lead to better mechanical strength, and can be utilized for device integrations as well as fabricating small thermoelectric devices.

The ion implantation and masking techniques, such as those discussed in connection with the above process, can also be employed to form not only in-plane thermoelectric structures but also other structures in which some of the legs are in one plane and others in another (e.g., a parallel plane). For example, the ion diffusion processing can be utilized to form p and n-type legs in two thermoelectric layers, and then bond those layers to form a multi-stage thermoelectric structure.

The above fabrication techniques can also be adapted to form thermoelectric structures such as that schematically depicted in FIG. 5D above. For example, such structures can be fabricated by utilizing ion implantation, e.g., via diffusion processes, in conjunction with proper masks.

Figure 12:
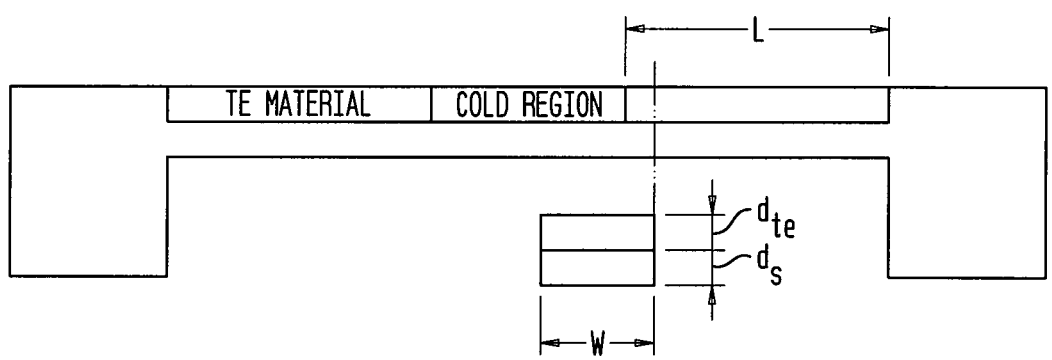
FIG. 12 shows schematically a generic, single-stage, film-based thermoelectric device.

As noted above, in many embodiments, the parameters of a multistage thermoelectric micro cooler according to the teachings of the invention are selected so as to minimize heat leakage (e.g., by conduction, radiation and/or convection) back to the cold platform (island) of the cooler. The selection of these parameters can be better understood by considering heat leakage in a generic, single-stage, film-based thermoelectric device, such as that shown schematically in FIG. 12. First, the space between the cold region and the ambient should be preferably evacuated so as to eliminate conventional heat loss. It is interesting to note in this regard that even back-filling this space with materials having ultra-low thermal conductivities, such as areogels, may not provide sufficient insulation and hence may result in conduction heat loss of the order of 100 microwatts (μW) or higher. Second, the conduction heat leakage through supporting materials for the thermoelectric legs and/or associated interconnects need to be minimized. Because thermoelectric materials usually have a low thermal conductivity (e.g., about 1 W/mK), comparable to that of the typical device supporting materials used in MEMS (such as $SiO_2$ or $Si_3N4$), heat leakage through such supporting materials can be substantial. For example, for equal lateral area, the relative heat flow through a thermoelectric (te) film and its associated supporting material (support) can be given by $(kd)_{te}/(kd)_{support}$, where k designates thermal conductivity and d denotes the film thickness. Thus, an MTMCC should have very thin or no supporting materials.

Metallic layers used for interconnect or other purposes (radiation shielding, seed layer for electrodeposition) should also be minimized as they can be even more problematic due to their high thermal conductivity. While convention and parasitic heat conduction losses can be minimized by utilizing vacuum insulation and other design choices, such as those described above, radiation heat loss can be more difficult to overcome. For the configuration of FIG. 12, the radiation heat loss, compared to intrinsic heat conduction through the thermoelectric legs (Qrad/Qcond), is approximately $\epsilon A_s \sigma(T_a^4 - T_c^4)/[k_{te} A_c (T_a - T_c)/L_{te}]$, where $\epsilon$ is the emissivity of the surface, $A_S$ [about $2(w+d)/L_{te}$] is the surface area of the leg, $A_c$ (=wd) is the cross-sectional area of the film, and $L_{te}$ is the length of the thermoelectric element. Although coating the surface with additional layers can reduce emissivity, it is typically not desirable because of the associated heat conduction loss. For example, assuming $L_{te}$=200 microns, $\epsilon$=0.5, $T_a$=300 K, $T_c$=160 K, $k_{te}$=1 W/mK leads to Qrad/Qcond$\approx 10^{-7}$ (w+d)/(wd). If it is further assumed that the leg width (w) is 20 microns, and the thermoelectric film thickness (d) is 1 micron, the calculated radiation loss is about 26% of the heat conduction along the thermoelectric legs. However, when thicker films are utilized, a substantial reduction in radiation loss is achieved. For example, for d=40 microns, the radiation loss reduces to about 2%. Thus, as also noted above, in many embodiments of the invention, thick films (e.g., films having a thickness greater than about 1 micron) are utilized for forming the thermoelectric legs so as to minimize the radiation heat loss. The use of thick films also reduces parasitic heat conduction loss through any additional films needed for device fabrication, and further alleviates the conduction loss of the seed layers used in electrodeposition processes.

In addition to the use of thick films, in many embodiments, the thermoelectric materials utilized for forming the legs are chosen to exhibit good thermoelectric figure-of-merit, generally defined as $Z=S^2\sigma/k^4$, where S is the Seebeck coefficient, $\sigma$ is the electrical conductivity, and k is the thermal conductivity. The parameter Z has units of inverse Kelvin. Hence, the non-dimensional figure-of-merit ZT is often used. At room temperature and below, the alloys of $Bi_2Te_3$ (e.g., $Bi_2Se_3$ (n-type) and $Sb_2Te_3$ (p-type)) are some of the preferred materials for use in forming the thermoelectric legs of multistage thermoelectric micro coolers of the invention. It should, however, be understood that any other suitable thermoelectric materials can also be employed in forming the multistage thermoelectric micro coolers in accordance with the teachings of the invention.

Those having ordinary skill in the art will appreciate that various modifications can be made to the above embodiments without departing from the scope of the invention.

What is claimed is:

1. A multistage thermoelectric cooler, comprising
a plurality of p-type legs each having a longitudinal axis and a plurality of n-type legs each having a longitudinal axis, the longitudinal axes of the plurality of p-type legs being non-parallel to the longitudinal axes of the plurality of the n-type legs, the plurality of p-type legs and the plurality of n-type legs being coupled at a plurality of p-n junctions to form a plurality of thermoelectric cooling stages in which at least a portion of a current flowing, during operation of the cooler, through one stage is coupled into a subsequent stage,
wherein at least one of said p or n-type legs is a unitary continuous leg spanning a plurality of cooling stages;
wherein each of the plurality of cooling stages includes a p-n junction; wherein the plurality of n-type legs are oriented at an oblique angle with respect to the plurality of p-type legs such that the p-type legs and the n-type legs are arranged in a cross-bar configuration in which at least one of the n-type legs forms contact p-n junctions with three different ones of the p-type legs at a first end region, a central region, and a second end region of the at least one of the n-type legs and at least one of the p-type legs forms contact p-n junctions with three different ones of the n-type legs at a first end region, a central region, and a second end region of the at least one of the p-type legs;
wherein the plurality of n-type legs are arranged entirely in a first single layer such that the longitudinal axes of the n-type legs are parallel to one another and entirely disposed in a first plane; and
wherein the plurality of p-type legs are arranged entirely in a second single layer such that the longitudinal axes of the p-type legs are parallel to one another and entirely disposed in a second plane, the second plane being parallel to the first plane and distinct from the first plane and the second single layer being distinct from the first single layer.

2. The multistage cooler of claim 1, wherein at least two of said stages exhibit a difference in heat dissipation.

3. The multistage cooler of claim 2, wherein a leg portion associated with a cooling stage is characterized by a length (L) and a cross-sectional area (A), wherein ratios of length to cross-sectional area (L/A) associated with p-type or n-type leg portions of at least two of said stages are different.

4. The multistage cooler of claim 1, wherein at least two leg portions corresponding to a cooling stage exhibit different ratios of length to cross-sectional areas.

5. The multistage cooler of claim 3, wherein the L/A ratio associated with at least a p-type or n-type leg portion of the one of said at least two stages that dissipates more heat is less than a corresponding ratio of the other stage.

6. The multistage cooler of claim 1, further comprising an electrode electrically coupled to one of said stages to apply a current thereto.

7. A multistage thermoelectric cooler, comprising:
at least first and second thermoelectric cooling stages comprising a plurality of p-type thermoelectric legs each having a longitudinal axis and a plurality of n-type thermoelectric legs each having a longitudinal axis, the longitudinal axes of the plurality of p-type thermoelectric legs being non-parallel to the longitudinal axes of the plurality of the n-type thermoelectric legs, the plurality of p-type legs and the plurality of n-type legs being coupled to one another so as to form a plurality of p-n junctions, each leg spanning both stages such that a first portion of each leg extending from one end thereof to one of said p-n junctions belongs to one stage and a second portion of that leg extending from said p-n junction to another end thereof belongs to the other stage,
wherein said first and second portions of at least one of said legs form a physically undivided leg that spans said at least first and second cooling stages;
wherein the plurality of n-type legs are oriented at an oblique angle with respect to the plurality of p-type legs such that the p-type legs and the n-type legs are arranged in a cross-bar configuration in which at least one of the n-type legs forms contact p-n junctions with three different ones of the p-type legs at a first end region, a central region, and a second end region of the at least one of the n-type legs and at least one of the p-type legs forms contact p-n junctions with three different ones of the n-type legs at a first end region, a central region, and a second end region of the at least one of the p-type legs; and wherein the plurality of p-type legs are entirely disposed in a first single layer and wherein the longitudinal axes of the p-type legs are parallel to one another and entirely disposed in a first plane; and wherein the plurality of n-type legs are entirely disposed in a second single layer and wherein the longitudinal axes of the n-type legs are parallel to one another and entirely disposed in a second plane, the second plane being parallel to the first plane and distinct from the first plane and the second single layer being distinct from the first single layer.

8. The multistage cooler of claim 7, wherein a first temperature gradient develops across said first portion of said legs and a second temperature gradient develops across said second portions of said legs during operation of the thermoelectric cooler.

9. A multistage thermoelectric cooler, comprising a plurality of legs formed of a p-type thermoelectric material and a plurality of legs formed of an n-type thermoelectric material, each of said legs having a first portion extending from a first end thereof to a p-n junction across which a first temperature gradient is generated and a second portion extending from the p-n junction to a second end thereof across which a second temperature gradient is generated, said portions forming a contiguous undivided thermoelectric leg, wherein said legs are bonded so as to form an electrically and thermally conductive contact junction;

wherein the plurality of n-type legs are oriented at an oblique angle with respect to the plurality of p-type legs such that the p-type legs and the n-type legs are arranged in a cross-bar configuration in which at least one of the n-type legs forms contact p-n junctions with three different ones of the p-type legs at a first end region, a central region, and a second end region of the at least one of the n-type legs and at least one of the p-type legs forms contact p-n junctions with three different ones of the n-type legs at a first end region, a central region, and a second end region of the at least one of the p-type legs; and wherein the plurality of n-type legs are arranged entirely in a first single layer such that longitudinal axes of the n-type legs are parallel to one another and entirely disposed in a first plane; and wherein the plurality of p-type legs are arranged entirely in a second single layer such that longitudinal axes of the p-type legs are parallel to one another and entirely disposed in a second plane, the second plane being parallel to the first plane and distinct from the first plane and the second single layer being distinct from the first single layer; wherein the longitudinal axes of the plurality of p-type legs being non-parallel to the longitudinal axes of the plurality of the n-type legs.

10. The thermoelectric cooler of claim 9, wherein each of said p-type and n-type legs has a thickness in a range of about 1 micron to about 1 mm.

11. The thermoelectric cooler of claim 9, wherein said first portion of each of the legs has a length different than that of the second portion of that leg.

12. The thermoelectric cooler of claim 9, wherein each of said legs has a length in a range of about 20 microns to about 1 mm.

13. The thermoelectric cooler of claim 9, further comprising a platform thermally coupled to said contact junction to be maintained at a lower temperature of said second temperature gradient.

14. The thermoelectric cooler of claim 13, wherein said platform is substantially transparent to electromagnetic radiation having one or more selected wavelength components.

15. The thermoelectric cooler of claim 9, further comprising a support substrate adapted for mechanically coupling to at least one of said legs.

16. The thermoelectric cooler of claim 15, wherein said support substrate comprises a peripheral portion surrounding a hollow central portion.

17. The thermoelectric cooler of claim 6, wherein the first portions of the legs at ends thereof maintained at a higher temperature of said first temperature gradient are mechanically coupled to said peripheral portion of the support substrate.

18. The thermoelectric cooler of claim 17, further comprising an electrical lead disposed on said peripheral portion and electrically coupled to said legs so as to apply an electrical current to said thermoelectric cooler.

19. The multistage thermoelectric cooler of claim 1, wherein the plurality of p-type legs and the plurality of n-type legs are formed, respectively, of p and n-type $Bi_2Te_3$-based alloys.

20. The multistage thermoelectric cooler of claim 1, wherein the second single layer overlaps the first single layer such that the at least one p-type leg extends over and across the three different n-type legs with which the at least one p-type leg forms contact p-n junctions.

* * * * *